United States Patent
Hopman et al.

(10) Patent No.: US 12,018,358 B2
(45) Date of Patent: Jun. 25, 2024

(54) METHOD FOR MANUFACTURING ScAlN TARGET

(71) Applicant: LAM RESEARCH CORPORATION, Fremont, CA (US)

(72) Inventors: Willem Cornelis Lambert Hopman, Deventer (NL); Jan Matthijn Dekkers, Aadorp (NL)

(73) Assignee: LAM RESEARCH CORPORATION, Fremont, CA (US)

( * ) Notice: Subject to any disclaimer, the term of this patent is extended or adjusted under 35 U.S.C. 154(b) by 372 days.

(21) Appl. No.: 17/411,140

(22) Filed: Aug. 25, 2021

(65) Prior Publication Data
US 2022/0064782 A1 Mar. 3, 2022

(30) Foreign Application Priority Data
Sep. 3, 2020 (EP) .................................. 20194369

(51) Int. Cl.
| C23C 14/34 | (2006.01) |
| C04B 35/581 | (2006.01) |
| C04B 35/645 | (2006.01) |
| C23C 8/02 | (2006.01) |
| C23C 8/24 | (2006.01) |
| C23C 8/80 | (2006.01) |
| C23C 14/06 | (2006.01) |
| C23C 14/28 | (2006.01) |

(52) U.S. Cl.
CPC ........ *C23C 14/0641* (2013.01); *C04B 35/581* (2013.01); *C04B 35/645* (2013.01); *C23C 8/24* (2013.01); *C23C 14/28* (2013.01); *C04B 2235/3224* (2013.01)

(58) Field of Classification Search
None
See application file for complete search history.

(56) References Cited

FOREIGN PATENT DOCUMENTS

| CN | 110562936 A | * 12/2019 |
| CN | 110562936 A | 12/2019 |
| CN | 111599915 A | 8/2020 |

\* cited by examiner

*Primary Examiner* — Anthony M Liang
(74) *Attorney, Agent, or Firm* — Alleman Hall & Tuttle LLP

(57) ABSTRACT

The invention relates to a method for producing a scandium aluminum nitride (ScAlN) target body for pulsed laser deposition (PLD), which includes the steps of: providing a scandium aluminum alloy body; pulverizing the scandium aluminum alloy body into scandium aluminum particles; nitridizing the scandium aluminum particles into scandium aluminium nitride particles; and hot pressing the scandium aluminum nitride particles into a scandium aluminum nitride target body.

9 Claims, 2 Drawing Sheets

METHOD FOR MANUFACTURING ScAlN TARGET

CROSS-REFERENCE TO RELATED APPLICATION

This application claims priority to European Patent Application No. 20194369.3 filed Sep. 3, 2020, the disclosure of which is hereby incorporated by reference in its entirety.

BACKGROUND OF THE INVENTION

Field of the Invention

The invention relates to a method for producing a scandium aluminum nitride (ScAlN) target body for pulsed laser deposition (PLD).

Description of Related Art

With PLD a film can be arranged on a substrate by irradiating a target material with a laser beam. Due to the high energy of the laser beam a plasma will be generated from the target material. This plasma is then deposited onto a substrate, such that a film of the target material is formed.

Aluminium Nitride (AlN) is a well-known piezoelectric thin film material. The piezoelectric performance can be significantly improved by doping with Scandium as high as 50 at %. In particular a scandium aluminum nitride film is suitable as piezoelectric layers in acoustic filters for radiofrequency filter applications and in micro-electro-mechanical systems such as miniature microphones and ultrasound transducers.

It is known to compose a target body by hot pressing a mixture of a powder of scandium nitride and a powder of aluminum nitride. Although the produced target body is not composed out of ScAlN, the film formed on a substrate by PLD will be ScAlN as during the plasma generation of the target material, the scandium nitride and aluminum nitride will mix in the plasma and deposit as a ScAlN film.

However, the target body formed out of the mixture of a powder of scandium nitride and a powder of aluminum nitride results in difference in optical absorption of the laser in the PLD process. Furthermore, a mixture of both powders has a relative low density. This is caused by differences in the particle size of the two powders, which make it difficult to obtain a homogeneous mixture of the powders and which prevent the mixture to be compressed at high pressures. When the mixture is compressed at high pressure, the difference in particle size and thermal expansion of both powders will result in local stresses with cracks in the target body as result.

If such a target body is used for prolonged time in a PLD process a shift in the composition of the ScAlN deposited film can occur because the scandium nitride particles may slightly behave differently when irradiated by a laser beam to generate a plasma than the aluminum nitride particles in the target body. The bandgap for optical absorption of scandium nitride in the target body is 2.0 eV, whereas the bandgap for aluminium nitride is 6.15 eV. The energy of an ultra-violet laser used in a PLD process is typically between 4 to 6 eV. So clearly, the PLD process is therefore not efficient for a target body composed out of two different material, as the laser absorption is significantly different for both materials. A As a result many droplets will be ejected from the target body, which is undesired.

SUMMARY OF THE INVENTION

It is an object of the invention to reduce or even remove the above mentioned disadvantages.

This object is achieved according to the invention with a method according to the preamble, which method comprises the steps of:

providing a scandium aluminum alloy body;
pulverizing the scandium aluminum alloy body into scandium aluminum particles;
nitridizing the scandium aluminum particles into scandium aluminium nitride particles;
hot pressing the scandium aluminum nitride particles into a scandium aluminum nitride target body.

With the method according to the invention scandium aluminum particles are converted into scandium aluminum nitride particles by the nitridizing process. As a single type of particles is then used to hot press a target body, it is possible to use higher pressure to obtain a target body of higher density compared to the prior art method in which a target body is hot pressed out of a mixture of two types of particles.

The resulting target body is composed out of true scandium aluminium nitride. This single phase material will have one single bandgap. The exact bandgap depends on the amount of Scandium, but will certainly be lower than the energy of UV lasers for scandium doping up to 50 at %. As a result the UV laser absorption is highly efficient and a prolonged usage of the target body in a PLD process without droplet formation is obtained.

In a preferred method according to the invention the nitridizing of the scandium aluminum particles comprises the step of feeding the scandium aluminum particles in a gas stream of nitrogen or ammonia ($NH_3$), while maintaining a temperature of the gas and scandium aluminum particles mixture of over 500° C.

By feeding the scandium aluminum particles to a gas stream of ammonia, a good contact between the scandium aluminum particles and the ammonia is obtained, which ensures a reliable transition of the particles into scandium aluminum nitride particles.

In another preferred embodiment of the method according to the invention the scandium aluminum nitride particles are hot pressed in an isostatic hot press. An isostatic hot press allows to subject a pressure in all directions onto the particles. This allows for a more uniform density within the produced target body.

With an isostatic hot press, the powder of scandium aluminum nitride particles is for example arranged in a flexible mould, which is then positioned within a pressure vessel, which is supplied with a pressurized fluid. The flexible mould is able to deform such that the pressurized fluid can act directly on the powder and compress the scandium aluminum nitride particles into a target body.

Preferably, the scandium aluminum nitride particles are hot pressed at a pressure of over 90 MPa, preferably at a pressure of 150-250 MPa.

It is furthermore preferred that the scandium aluminum nitride particles are hot pressed at a temperature of over 1600 degree C., preferably at a temperature of 1750-2200 degree C.

This will result in a target body composed out of ScAlN having a high density and homogeneous particle distribution.

In yet another embodiment of the method according to the invention the scandium aluminum alloy body is pulverized by grinding said body.

In still a further embodiment of the method according to the invention after the pulverizing step the scandium aluminum particles have a particle size smaller than 10 micrometer, more preferably smaller than 1 micrometer.

Such a particle size ensures that the nitridizing step of the scandium aluminum particles results in scandium aluminium nitride particles.

In yet another embodiment of the method according to the invention the scandium aluminum nitride target body comprises at least 20 at % scandium.

In still a further embodiment of the method according to the invention the scandium aluminum nitride particles are hot pressed into a scandium aluminum nitride target body with a relative density of above 80%, more preferably above 98%.

With such a high density a good absorption of the laser beam of a PLD process is achieved allowing for a prolonged use of the target body in the PLD process to deposit a scandium aluminum nitride film on a substrate.

BRIEF DESCRIPTION OF THE DRAWINGS

These and other features of the invention are schematically shown in the accompanying drawings.

DESCRIPTION OF THE INVENTION

Figure 1:
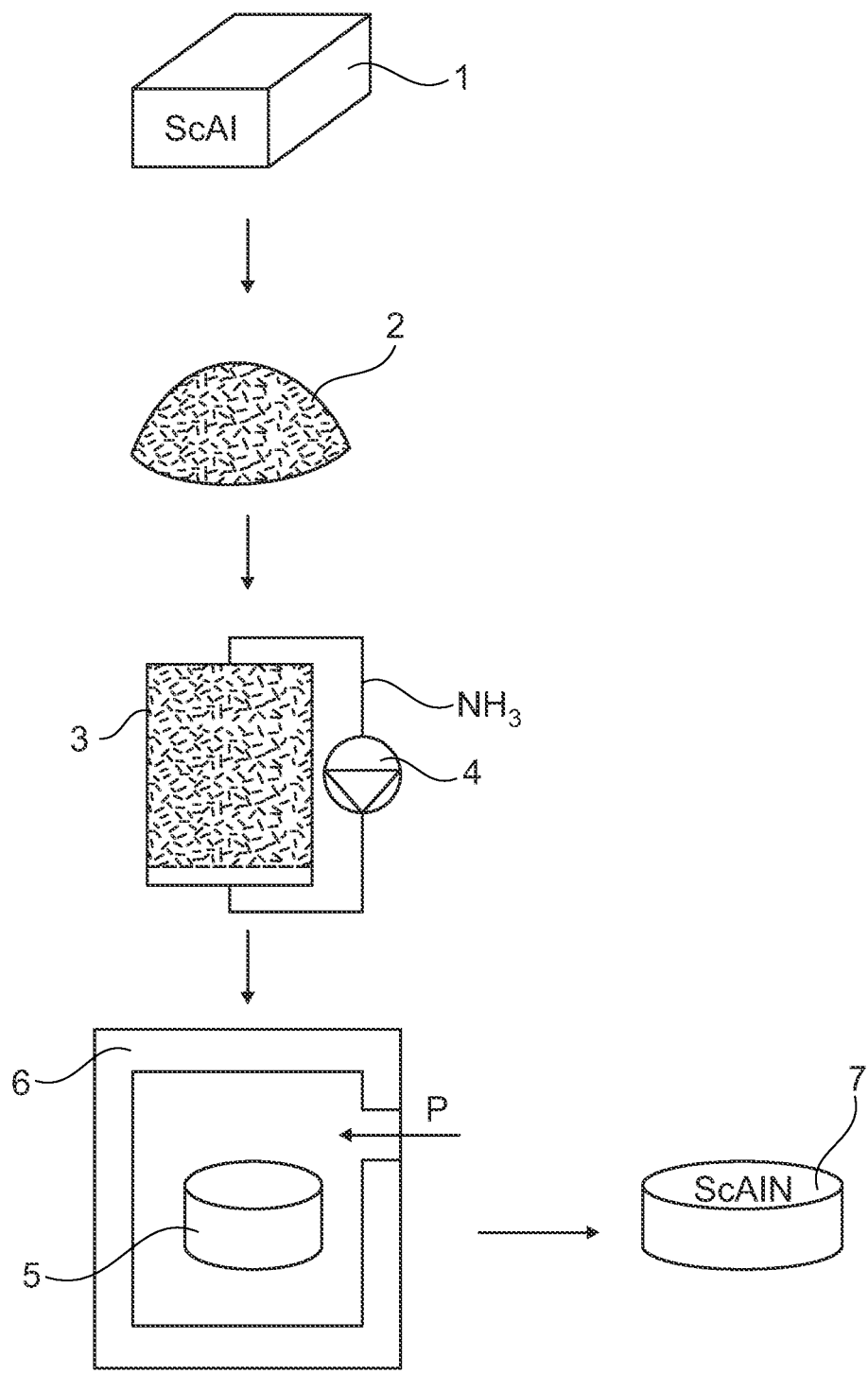
FIG. 1 shows schematically the steps of an embodiment of the method according to the invention.

In FIG. 1 first a scandium aluminum (ScAl) alloy body 1 is provided. This ScAl body 1 is then pulverized, for example by grinding, into a powder 2 of scandium aluminium particles.

The ScAl powder 2 is then fed to a fluidized bed reactor 3, in which ammonia ($NH_3$) is pumped by a pump 4, while maintaining the temperature at for example 500° C. This allows for the particles of the ScAl powder 2 to be nitridized into scandium aluminium nitride particles.

After a certain amount of time, the nitridized particles are removed from the fluidized bed reactor 3 and arranged in a flexible mould 5, which is placed in a pressure vessel 6, which is supplied with a suitable pressure P, such that the mould 5 is subjected to an isostatic pressure. As a result the scandium aluminium nitride particles in the mould 5 will be compressed into a target body 7.

Figure 2B:
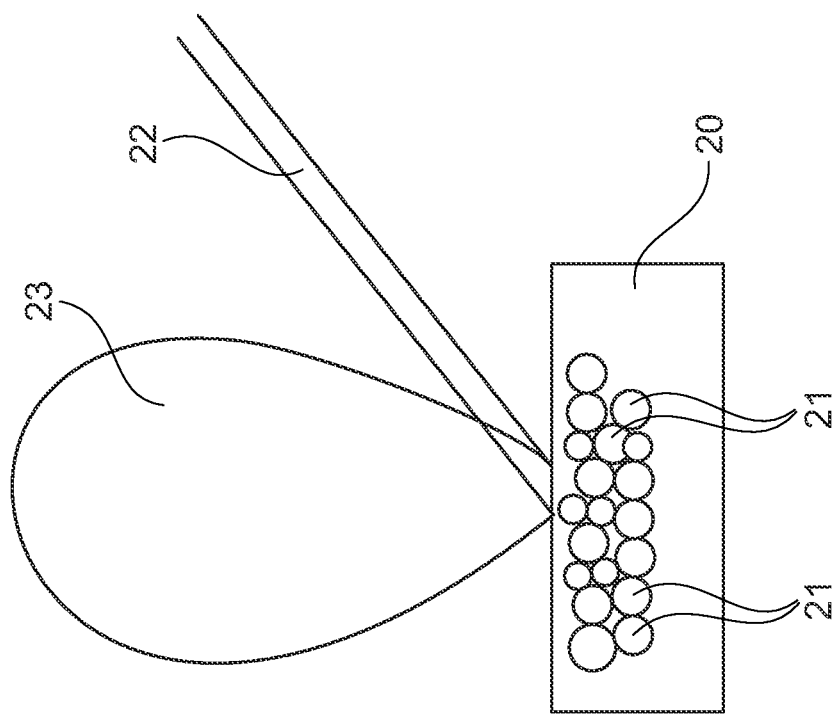
FIGS. 2A and 2B show the difference between a target body according to the prior art and a target body produced with the method according to the invention in a PLD process.
Figure 2A:
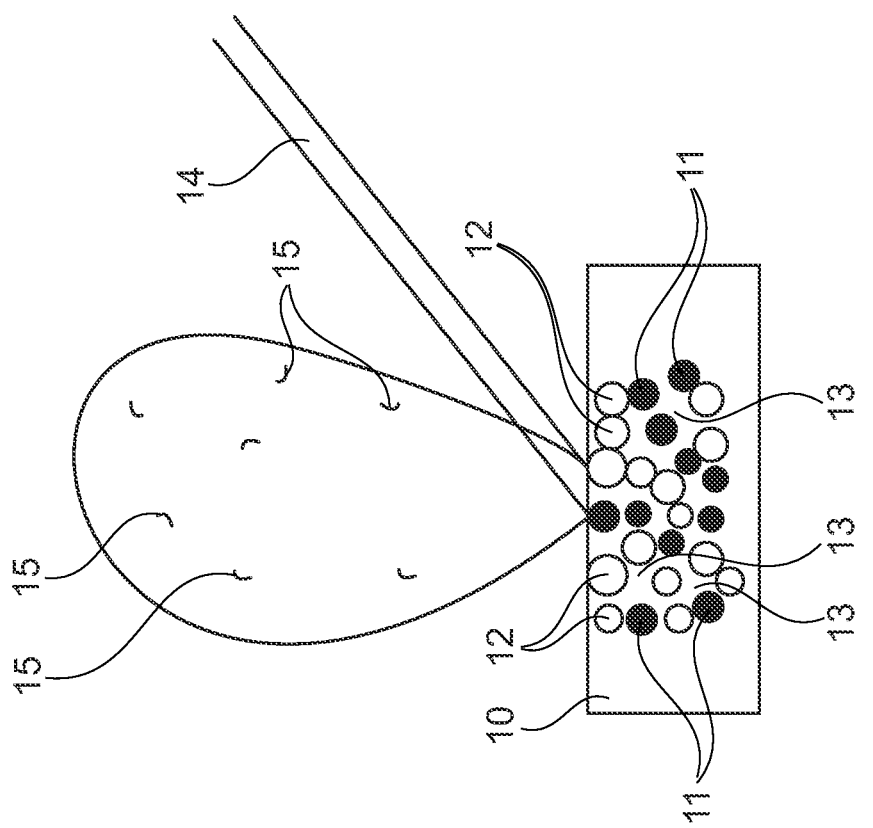

FIG. 2A shows schematically a target body 10 according to the prior art with separate scandium nitride particles 11 and aluminum nitride particles 12. Due to the different type of particles 11, 12 voids 13 are present in the target body 10.

When such a prior art target body 10 is irradiated with a laser beam 14 only part of the energy is absorbed by the particles 11, 12. But due to the difference in bandgap between scandium nitride and aluminum nitride, the scandium nitride particles 11 will more easily be transferred into a plasma than the aluminum nitride particles 12, which tend to break loose from the target body 10 as undesired droplets 15.

FIG. 2B shows schematically a target body 20 produced with the method according to the invention. The target body 20 is composed out of a single type of particles 21, in particular scandium aluminum nitride particles. As a single type of particles can be better compressed into a target body, the density of the target body 20 is considerably higher than the prior art target body 10. This already improves the absorption of the laser beam 22, which generates the plasma plume 23.

As scandium aluminum nitride has a bandgap lower than aluminum nitride, the laser beam 22 can more easily, more reliably and without generation of droplets transfer the target body material into a plasma plume 23.

The invention claimed is:

1. A method for producing a scandium aluminum nitride (ScAlN) target body for pulsed laser deposition (PLD), the method comprising:
   providing a scandium aluminum alloy body;
   pulverizing the scandium aluminum alloy body into scandium aluminum particles;
   nitridizing the scandium aluminum particles into scandium aluminum nitride particles; and
   hot pressing the scandium aluminum nitride particles into a scandium aluminum nitride target body.

2. The method according to claim 1, wherein the nitridizing of the scandium aluminum particles comprises a step of feeding the scandium aluminum particles in a gas stream of nitrogen or ammonia ($NH_3$) to form a gas and scandium aluminum particles mixture, while maintaining a temperature of the gas and scandium aluminum particles mixture of over 500° C.

3. The method according to claim 1, wherein the scandium aluminum nitride particles are hot pressed in an isostatic hot press.

4. The method according to claim 1, wherein the scandium aluminum nitride particles are hot pressed at a pressure within a range of 90 MPa to 250 MPa.

5. The method according to claim 1, wherein the scandium aluminum nitride particles are hot pressed at a temperature within a range of 1600 degrees C. to 2200 degrees C.

6. The method according to claim 1, wherein the scandium aluminum alloy body is pulverized by grinding said body.

7. The method according to claim 1, wherein after the pulverizing step the scandium aluminum particles have a particle size smaller than 10 micrometers.

8. The method according to claim 1, wherein the scandium aluminum nitride target body comprises at least 20 at % scandium.

9. The method according to claim 1, wherein the scandium aluminum nitride particles are hot pressed into a scandium aluminum nitride target body with a relative density of above 80%.

* * * * *